US011096316B1

(12) United States Patent
Lachapelle

(10) Patent No.: US 11,096,316 B1
(45) Date of Patent: Aug. 17, 2021

(54) DISCRETE SET-POINT-BASED DATACENTER COOLING BASED ON EVAPORATIVE COOLING STATUS

(71) Applicant: Amazon Technologies, Inc., Seattle, WA (US)

(72) Inventor: Alan Joseph Lachapelle, Reston, VA (US)

(73) Assignee: Amazon Technologies, Inc.

( * ) Notice: Subject to any disclaimer, the term of this patent is extended or adjusted under 35 U.S.C. 154(b) by 141 days.

(21) Appl. No.: 16/122,798

(22) Filed: Sep. 5, 2018

(51) Int. Cl.
*G05B 15/02* (2006.01)
*H05K 7/20* (2006.01)
*H05K 7/14* (2006.01)

(52) U.S. Cl.
CPC ........ *H05K 7/20836* (2013.01); *G05B 15/02* (2013.01); *H05K 7/1488* (2013.01); *H05K 7/20136* (2013.01); *H05K 7/20145* (2013.01); *H05K 7/20209* (2013.01); *H05K 7/20309* (2013.01); *H05K 7/20736* (2013.01); *H05K 7/20818* (2013.01)

(58) Field of Classification Search
None
See application file for complete search history.

(56) References Cited

U.S. PATENT DOCUMENTS

| | | | | |
|---|---|---|---|---|
| 4,811,897 A * | 3/1989 | Kobayashi | ................ | F24F 3/00 236/49.3 |
| 2007/0037507 A1 * | 2/2007 | Liu | ......................... | F24F 11/77 454/229 |
| 2012/0197828 A1 * | 8/2012 | Yi | ...................... | H05K 7/20836 706/12 |
| 2014/0355203 A1 * | 12/2014 | Kondo | ............... | H05K 7/20836 361/679.51 |
| 2015/0053430 A1 * | 2/2015 | Beresford | ................ | A62C 3/16 169/45 |
| 2015/0156917 A1 * | 6/2015 | Ogawa | ................... | G01K 13/02 361/695 |
| 2015/0208554 A1 * | 7/2015 | Leigh | ........................ | G06F 1/20 165/80.3 |
| 2016/0073555 A1 * | 3/2016 | Shrivastava | ....... | H05K 7/20709 361/679.46 |
| 2016/0291656 A1 * | 10/2016 | Jenne | ........................ | G06F 1/26 |
| 2017/0280594 A1 * | 9/2017 | Sato | ....................... | G05B 15/02 |
| 2017/0321913 A1 * | 11/2017 | Dinnage | ................. | F24F 13/14 |

OTHER PUBLICATIONS

Ashrae Technical Committee (TC) 9.9, 2016, "Data Center Networking Equipment—Issues and Best Practices", 43 pages.
Ashrae Book, "Thermal Guidelines for Data Processing Environments", Third Ed., 2012, p. 79.

* cited by examiner

*Primary Examiner* — Bernard G Lindsay
(74) *Attorney, Agent, or Firm* — Kilpatrick Townsend & Stockton LLP

(57) ABSTRACT

Methods and systems for adjusting airflow to a set of datacenter electronic components can include receiving cooling requirement data for subsets of the components and temperature data associated with an air supply, determining local air supply set points for each subset of components based on the temperature data and parameters of the respective subsets of components, and adjusting local flow rates of air from the air supply to the subsets of components based on the local set points.

20 Claims, 9 Drawing Sheets

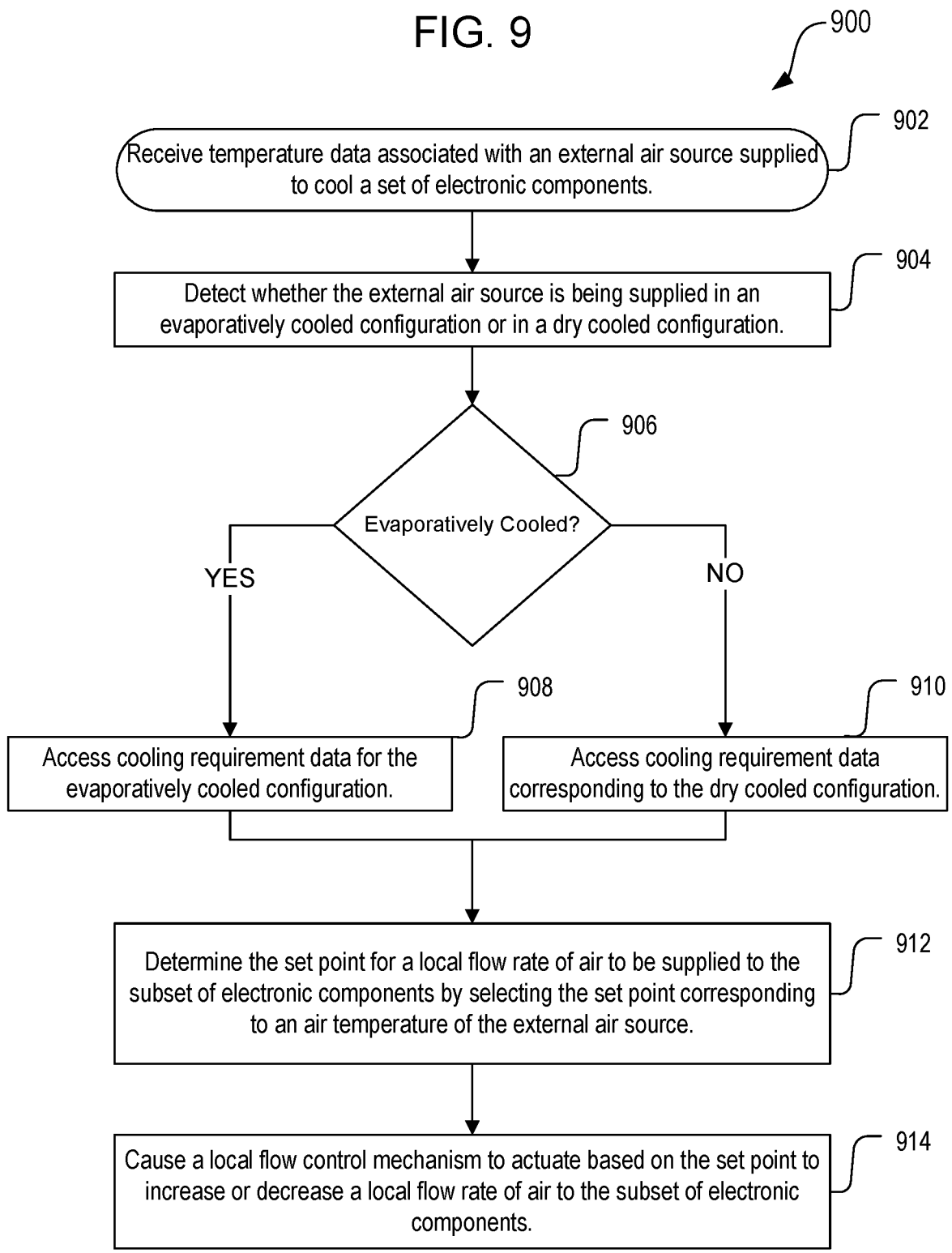

DISCRETE SET-POINT-BASED DATACENTER COOLING BASED ON EVAPORATIVE COOLING STATUS

BACKGROUND

A datacenter typically contains a collection of computer servers and components for the management, operation and connectivity of those servers. Even in isolation, these datacenter electronic components may generate sufficient heat that temperature management is important for prolonging the life of the datacenter electronic components and ensuring smooth and continuous operation of the datacenter. Typically, such datacenter electronic components are installed equipped with onboard cooling equipment, such as heat sinks and fans or even liquid cooling systems attached to components that produce the most heat, like processors. However, providing a supply of cool air can greatly improve the cooling efficiency of these cooling elements.

Datacenter electronic components are often arranged together. For example, datacenter electronic components can be vertically arranged in racks or within server cabinets. When heat-generating datacenter electronic components are arranged together, however, the cumulative generation of heat can increase the ambient temperature and exacerbate the challenge of managing the temperature of individual datacenter electronic components.

Datacenter electronic components may be cooled by passing air through the components. The effectiveness of a cooling system is related to the rate of airflow past the heat-generating datacenter electronic components and the relative temperature of the air as it passes through the system.

BRIEF DESCRIPTION OF THE DRAWINGS

Various embodiments in accordance with the present disclosure will be described with reference to the drawings, in which:

FIG. 9 illustrates a fourth example process for managing set point-based discrete datacenter component cooling, in accordance with various embodiments.

DETAILED DESCRIPTION

Figure 1:
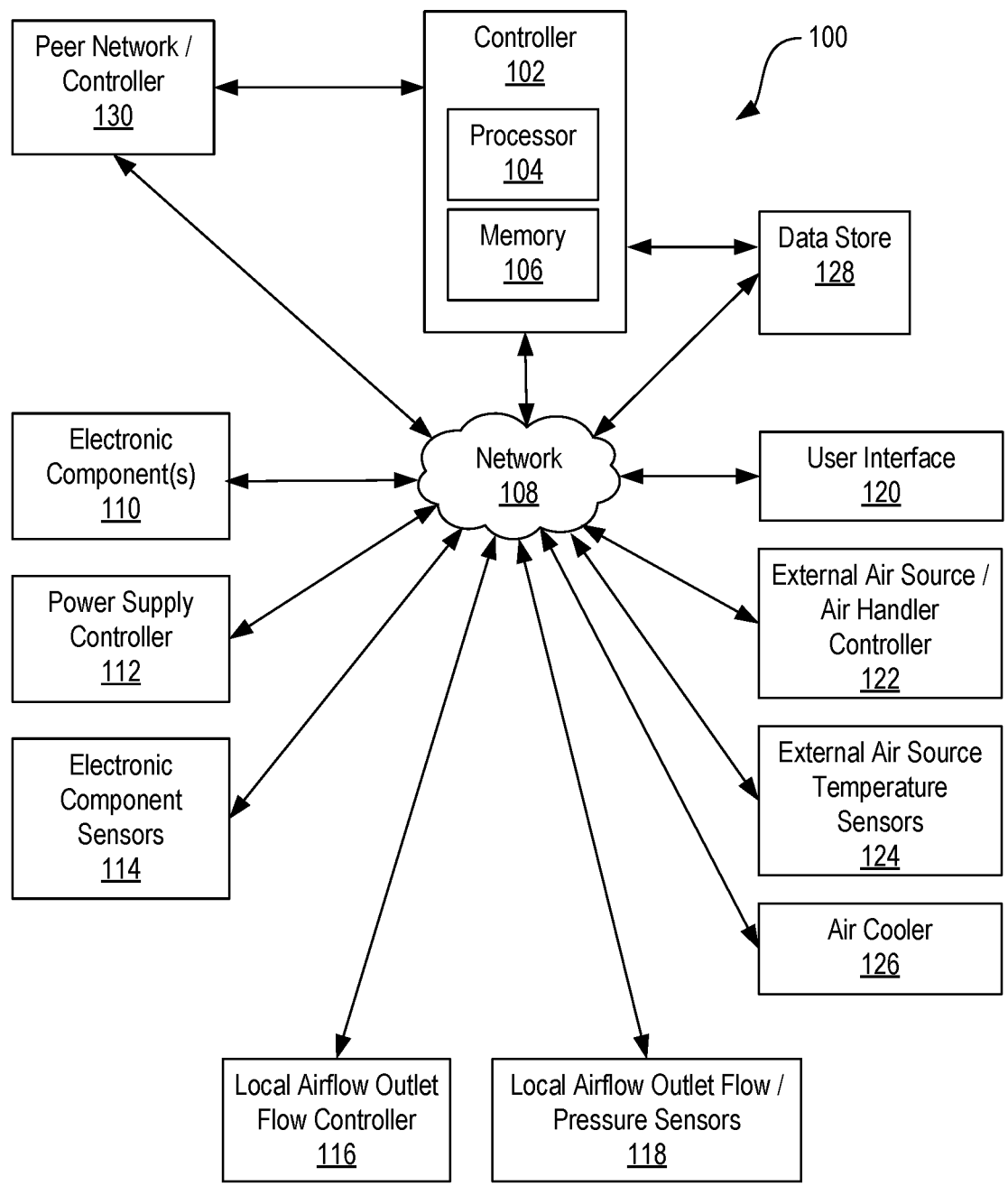
FIG. 1 is a simplified block diagram illustrating a system for managing discrete set point-based cooling in a datacenter, in accordance with various embodiments.

Air-cooled datacenter electronic components such as servers, switches, networking components, power supplies, and the like often employ both local and large-scale cooling systems to maintain operational temperatures. At the component level, many datacenter electronic components employ local cooling heat sinks and fans that pass air from the local environment over the components to draw away heat. Onboard temperature monitoring at the component level can be used to cause the local fans to increase or decrease fan speed to respond to datacenter electronic component temperatures, e.g., by speeding up when a component temperature passes a threshold and slowing down when the component temperature decreases back to an operational range. To increase cooling efficiency, large-scale cooling systems can control the temperature of the air in the environment around the components to a limited degree by providing cool air upstream of the local component fans. One conventional approach is the cold aisle/hot aisle arrangement, whereby datacenter electronic components are arrayed in racks along the walls of a cold aisle that is pressurized with cool air. Racks can include shelves, enclosures, or other structures that can support datacenter electronic components. For example, a server rack can include a frame containing multiple mounting slots or bays arranged to hold multiple, potentially many servers. Many suitable server racks can also hold power supply units, networking devices, or other heat-generating electronic components commonly used in datacenter operation. Racks can be configured to present an intake side of multiple datacenter electronic components to a cold aisle, and an outlet side to a hot aisle, thereby promoting a flow of cooling air in one direction through each of the datacenter electronic components. This cool air is allowed to pass from the cold aisle, through the components, and out into the hot aisle. However, this approach requires that the cold aisle pressure be maintained higher than the adjacent hot aisle pressure, and can be inefficient if there is variability in the cold air temperature, if some racks require more cold air than others, or if the cold aisle is prone to leaks or recirculation from the hot aisle to the cold aisle.

According to various embodiments, methods and systems disclosed herein relate to individually managing the delivery of cooling air to subsets of datacenter electronic components across multiple air delivery outlets. The amount of cold air delivered to each subset of datacenter electronic components can be tailored based on the specific cooling requirements of the components and the measured parameters (e.g., temperature, humidity) of the external air supply.

In at least one embodiment, a control system for controlling airflow in a datacenter manages airflow to datacenter electronic components on a rack-by-rack basis, or on the basis of groups of datacenter electronic component racks, or on any other suitable basis of subsets of electronic components that are located together. An external air source is provided for the datacenter and subdivided into multiple conduits for delivery to the subsets of datacenter electronic components. Each conduit terminates at a cold air outlet that includes a flow control mechanism, such as an adjustable diffuser, that can adjust the local flow rate of air at the outlet. Cold air outlets can be provided in various configurations including, but not limited to, underfloor plenums or duct outlets positioned at any suitable height.

The respective cooling requirements of each subset of datacenter electronic components are determinable based on their total power load or power requirements, or can be empirically determined and stored at a data store for access by a system controller. Each set of cooling requirements may include a predefined matrix of set points associated with a range of possible air supply temperatures. The set points can take various forms in accordance with the various embodiments disclosed herein, including but not limited to: a flow rate requirement for cooling the subset of electronic devices at a known air temperature (e.g., in terms of cubic volume over time), a pressure requirement based on a known cold air outlet geometry, or a direct flow control setting (e.g., an open percentage or an open area, based on known flow rates resulting from cold air outlet settings). As used herein, "set point" can refer interchangeably to any suitable setting for direct or indirect control of the local flow rate of air, including but not limited to: a flow rate set point, a pressure set point, or a physical parameter such as a flow control setting at a flow control mechanism.

The control system can receive temperature data associated with the external air source, including the temperature and/or humidity of the air source, as well as the cooling requirement data associated with the subset of the datacenter electronic components. Based on these data, the system can determine an optimal set point for cooling the subset of datacenter electronic components, and then control a local flow rate of cooling air to the subset of electronic components by way of the local flow control mechanism based on the set point. Because the optimal amount of airflow for cooling any one datacenter electronic component is not necessarily the same as the amount needed to cool each other datacenter electronic component, the system individually controls the local flow rate of cooling to each subset of components. Although individual efficiency gains for optimizing cooling for small groups of datacenter electronic components may be small, optimizing cooling across a large datacenter can add up to significant energy and cost savings.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, in which like numbers indicate like components, FIG. 1 illustrates an example of a system 100 for controlling the distribution of cooling air in a datacenter. The system 100 includes a controller 102 which includes a processor 104 and memory 106 that can be accessed by the processor and contains instructions for managing components of the system. The controller 102 can communicate with the various components of the system 100 by way of a network 108, which can be any suitable form of wireless network (e.g., Bluetooth®, WiFi, or the like) or wired network, or combination, including direct connection between the controller 102 and any suitable component. The system 100 can also include a data store 128 that contains cooling requirement data associated with the various datacenter electronic components 110, or with co-located subsets or groups of the datacenter electronic components. In some embodiments, the system 100 can include a user interface 120 for receiving commands and displaying information to users. For example, the system 100 can receive manual updates to adjust the set point values for the system at the data store 128 by way of the user interface, or can display indications or warnings for operators including temperature warnings or other indications. Suitable user interfaces can include computer displays and input devices, tablets, cell phones, or other networked devices that communicate with the controller 102.

According to some embodiments, the system 100 can base decisions upon setting set point values at the data store 128 from data regarding successful set point values utilized in comparable peer networks or controllers 130 of other datacenter cooling systems. A peer network or controller 130 may manage other cooling systems in the same datacenter site, e.g., cooling systems for other cold aisles, cooling systems for other areas of the same cold aisle, or cooling systems in different buildings; or can include other cooling systems associated with separate datacenter sites. For a given peer network or controller 130, the system periodically updates the set point values at the data store 128 by iteratively detecting whether stored set points result in adequate cooling of datacenter electronic components 110, and subsequently updating the set point values when adjustments are needed, or in response to user instructions. Information regarding datacenter conditions and successful set point values can be propagated by the system to other peer networks or controllers 130 and used to improve the accuracy of the set point values at the peer network or controller receiving the information.

Datacenter electronic components 110 can include many types of heat-generating electronics typically found in datacenters, such as servers, switches, power supplies, and the like. Typically, datacenter electronic components 110 are arranged in racks, shelves, enclosures, or similar structures that can support datacenter electronic components and that contain local cooling mechanisms such as fans and heat sinks. When operating at high temperatures or at increased loads, the datacenter electronic components 110 are generally capable of increasing local airflow on demand, but rely on the cooling system 100 to provide a source of cool air for long-term stability. Each enclosure or rack, or in some cases each individual component 110, can include one or more power supply controllers 112 that manage the amount of power supplied to the components therein, as well as temperature sensors 114 for detecting the temperature of sensitive components.

The system 100 also includes an air handler 122 for moving air from an external air source. In some embodiments, multiple and potentially many air handlers 122 may be used to supply the air source in a datacenter, and each air handler may also be operable to adjust the flow rate or pressure of the air source based on need, e.g., providing more airflow when the external air source is relatively warm, or providing less airflow when the air source is relatively cool. In some embodiments, the air handler 122 may also include the flow rate or pressure of the air source based on additional demand for cooling air caused by increased loads on the datacenter electronic components 110.

The system 100 can detect parameters of the external air source at or upstream of the air handler by way external air source temperature sensors 124, which can be used to determine a dry bulb temperature of the external air, a wet bulb temperature, and/or humidity of the external air. The system can also include an air cooler 126, typically including an evaporative cooling module that is operable to decrease the temperature of incoming air by way of water-based evaporative cooling. In some embodiments, the system is configured to engage an evaporative cooling configuration when the dry bulb temperature of the external air is above a threshold temperature, e.g., about 27° C., although any suitable temperature may be used as the threshold.

In some embodiments, the system 100 can employ a bypass damper in conjunction with evaporative cooling at the air handler to maintain the supply air temperature at or below a suitable, specific temperatures. However, as long as the dry bulb temperature of the external air is less than the threshold, the system can operate in a dry cooling configuration, whereby the supply air temperatures can vary across a wide range of temperatures less than the threshold temperature for evaporative cooling. In typical climates, evaporative cooling can be indicated at temperatures in the range of 24-29° C., or 23-29° C. in dry climates. In datacenter cooling systems that employ highly efficient component cooling, or in which the datacenter electronic components are operable at high temperatures, evaporative cooling of supply air can be reserved for even higher temperatures, e.g., 29° C. and more.

The datacenter electronic components 110 are organized into subsets of components that are co-located, i.e., each component of a given subset being positioned in the same rack, enclosure, or other suitable structure; or positioned in multiple racks or enclosures that are located adjacent or proximate to each other. In some embodiments, for each subset of components 110, the data store 126 stores known cooling requirement data, such as known cooling rate volumes for a given set of temperatures, determined empirically or determined based on the power requirements of the components therein. The cooling requirement data can include values corresponding to the amounts of cooling air required to cool the subset of components across a range of supplied air temperatures, or can include direct measures of the outlet pressure, or outlet diffuser configurations for a known local cold air outlet, that will result in optimal cooling of the specific subset of components. In some embodiments, the cooling requirement data can include multiple matrices of set points and air supply temperatures for multiple conditions, e.g., for the evaporatively cooled configuration and the dry cooled configuration. In some other embodiments, the cooling requirement data can include an array of air supply temperatures and humidity values with corresponding set points for each set of temperature and humidity values.

In operation, the system can employ a local flow controller 116 configured to increase or decrease the local flow of air from a local airflow outlet corresponding to the subset of datacenter electronic components 110. Management of the local flow of air can be performed by determining the set point as described above and then applying the set point to the local flow controller 116. In some embodiments, the system can also sense parameters of the local flow of air upstream of the local airflow outlet by way of local sensors 118, such as but not limited to airflow sensors or pressure sensors. In such cases, the system 100 may also be able to iteratively adjust the set point by iteratively detecting whether the local flow rate or local pressure at a given outlet is in line with an expected flow rate or within a range of expected flow rates corresponding to the set point.

Figure 2:
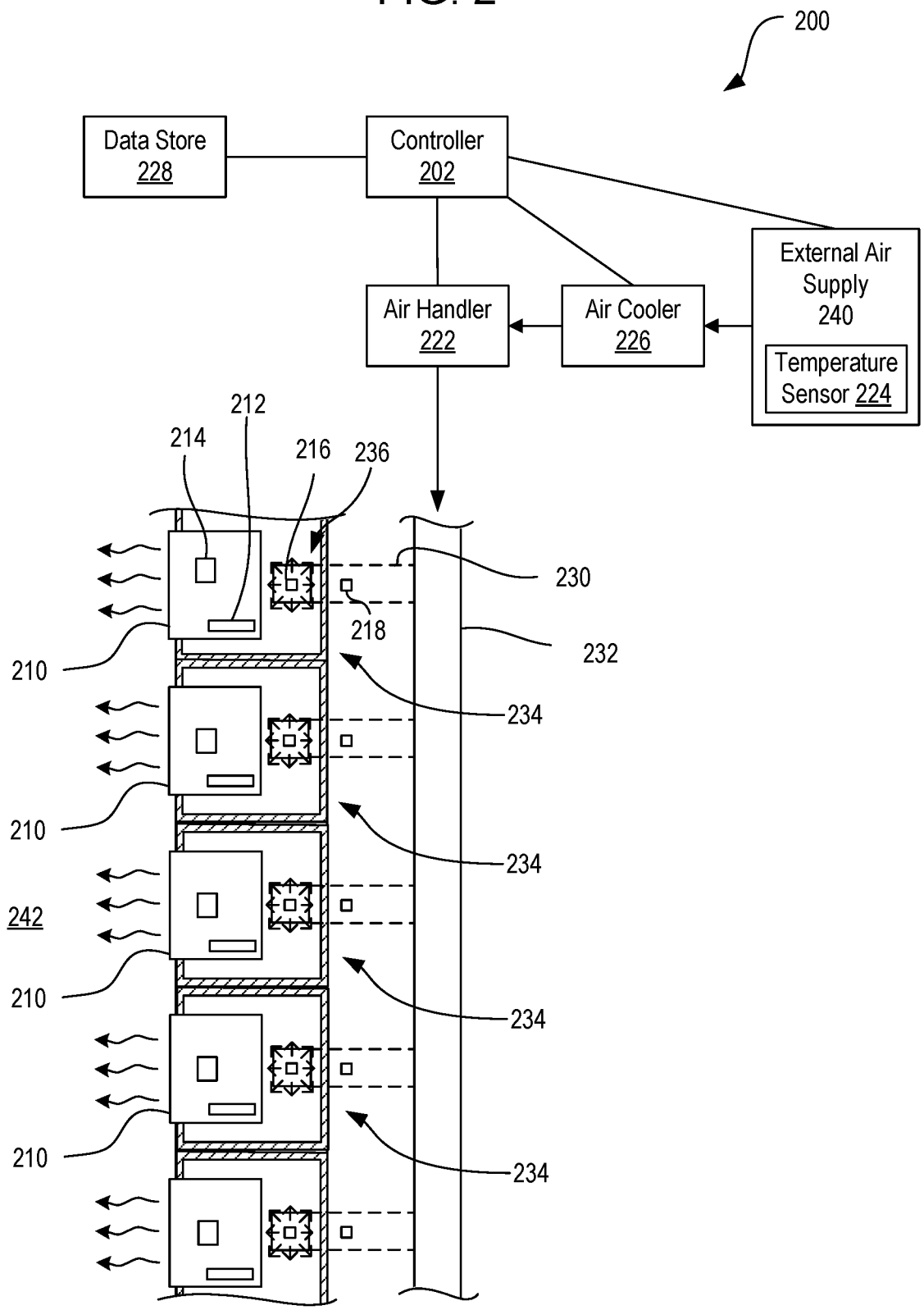
FIG. 2 is a top view diagrammatic illustration of a first example of a discrete datacenter component cooling system, in accordance with various embodiments.

The embodiments disclosed herein generally rely on some proximity between each subset of electronic devices 110 and the associated local airflow outlets 116; however, a variety of specific configurations of the electronic devices and outlets are possible within the scope of this disclosure. FIG. 2 is a top view diagrammatic illustration of a first example of a discrete datacenter component cooling system 200, in accordance with various embodiments. Reference numerals used herein relate to like components except where explicitly indicated otherwise.

In the cooling system 200, a controller 202 (similar to controller 102, FIG. 1) can communicate with the various components of the system 200, including accessing a data store 228 that contains cooling requirement data associated with the various subsets of datacenter electronic components 210. As shown herein, the subsets of datacenter electronic components 210 are organized in a series of enclosures 234, each subset of datacenter electronic components 210 corresponding to an electronic component rack such as a server rack. In operation, a cooling flow of air is received into the system from an external air supply 240, such as an external air inlet, and pushed into the cooling system 200 by an air handler 222. In some embodiments, the air supply can be passed through an air cooler 226, e.g., an evaporative cooler, before or after being passed through the air handler 222. Typically, at least one set of temperature sensors 224 is configured either in the outside environment from which the external air supply is received, or else upstream or downstream of the air handler 222 for measuring the wet bulb temperature, dry bulb temperature, and/or humidity of the external air supply.

In operation, the system captures and distributes the external air supply by way of the air handler 222. The external air source is then distributed, by way of one or more system conduits 232 to multiple local conduits 230, from which the air supply is emitted at local cold air outlets 236 to cool the datacenter electronic components 210. After passing through the components 210, the air flows into an exhaust environment 242, such as a hot aisle or the like. Each subset of datacenter electronic components 210 is arranged to receive a local flow of air from a respective cold air outlet 236 positioned adjacent or near the subset of components. In some other embodiments, the cold air outlets can be positioned to direct cooling air into enclosures 234 associated with each subset of datacenter electronic components, so that cooling air is not inadvertently pulled elsewhere. In various other embodiments, the cold air outlets 236 are positioned in an open aisle proximate to their respective subsets of datacenter electronic components 210, without individual enclosures.

The amount of air delivered to each cold air outlet 236 can be adjusted independent of each other cold air outlet by way of a local flow controller 216. Local flow controllers 216 can include adjustable diffusers, dampers, or other flow control mechanisms that can be actuated by the system 200 based on a set point. In some other embodiments, local flow or pressure sensors 218 can detect the flow rate or pressure at the outlet 236, and the local flow controller 216 can adjust an aperture at the cold air outlet 236 until the flow rate or pressure meets a cooling requirement associated with the set point.

Figure 3:
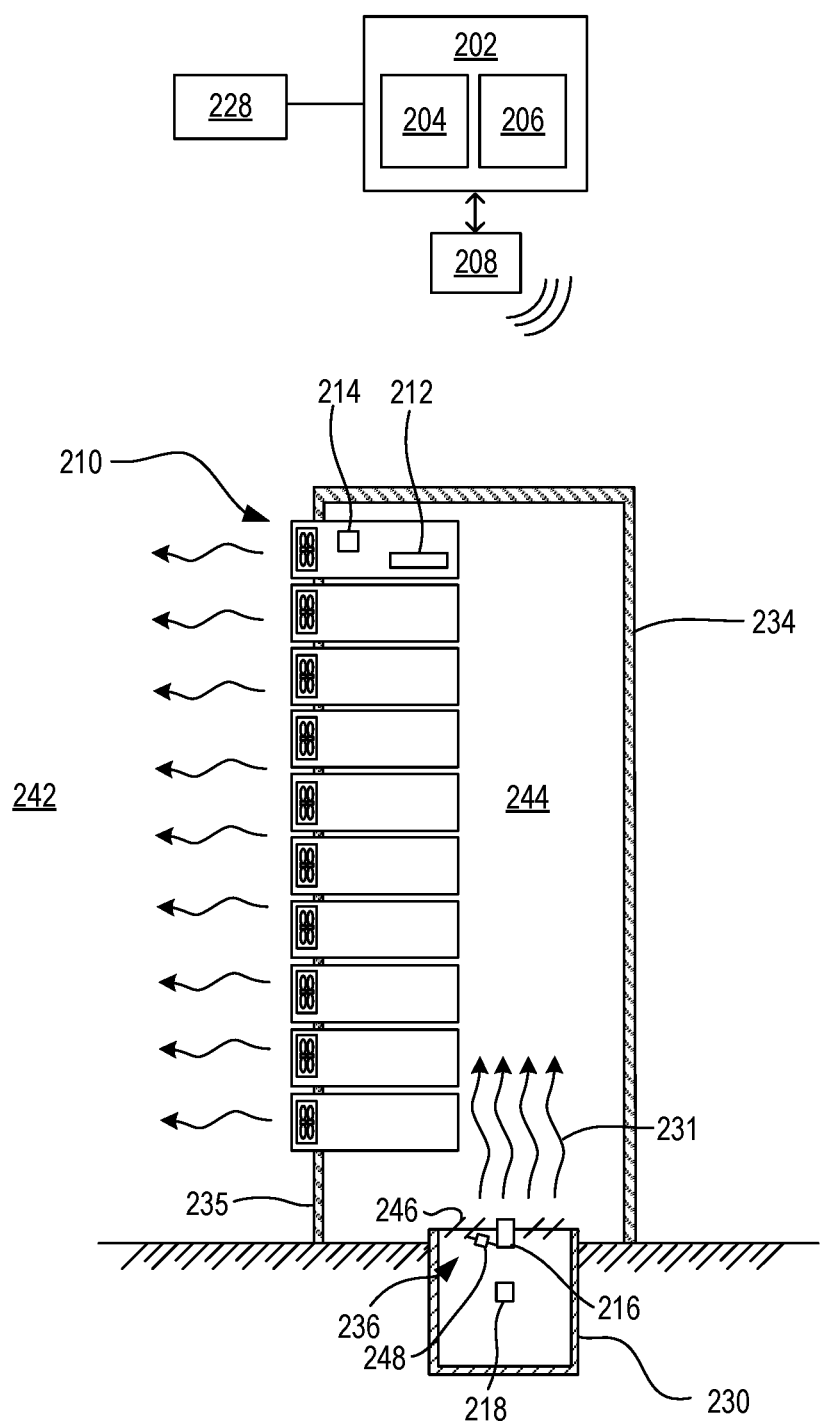
FIG. 3 is a side view diagrammatical illustration of a component enclosure in the cooling system of FIG. 2, employing a local air supply.

FIG. 3 is a side view diagrammatical illustration of a component enclosure in the cooling system of FIG. 2, employing a local air supply outlet. As shown, the controller 202, including a processor 204 and memory 206, can communicate with the various elements and local controllers by way of a network 208, which can be a wired or wireless network. In addition, the controller 202 can access a data store 228 for retrieving set point information.

The subset of datacenter electronic components 210 is shown herein as a side cutaway view of a server rack, wherein each component includes its own local fans for managing temperature spikes. In addition, each of the components 210 can include onboard temperature sensors 214 and power supplies 212. In some embodiments, a power supply may be common to all of the components 210 in a rack or to a subset of the components. The amount of air required to cool the subset of datacenter electronic components 210 may be determined empirically on a per-subset basis, or may be determined on the fly based on the power requirements of the components.

The local air conduit 230 is positioned proximate to the subset of electronic devices 216 and directs a local flow of air 231 into a cold air region 244 from which the electronic devices take up cooling air. In some embodiments, this cold air region 244 is an open area upstream of the electronic devices, without enclosures. In some other embodiments, the cold air region 244 is a cold aisle, where multiple subsets of electronic devices 210 may be positioned adjacent one another, each subset of devices having its own associated cold air outlet 236. In such cases, the cold region 244 and hot exhaust region 242 may be separated from each other by a divider 235 to prevent recirculation of hot air into the cold region. The subset of datacenter electronic components 210 exhausts warm air to an exhaust region 242, or hot aisle. Some mixing of cold air between adjacent cold air outlets 236 may be expected, but the predominant effect of having localized airflow control will still be to provide the optimal local air flow to each subset of electronic devices 210. In some embodiments, the cold air region 244 may include multiple enclosures 234 that bound or partially bound regions around each subset of datacenter electronic components 210 and their corresponding cold air outlets 236, to minimize mixing of cold air between adjacent cold air outlets.

In operation, the local air flow 231 emitted from the cold air outlet 236 can be adjusted by the local flow controller 216, which can include any suitable mechanism for adjusting the flow of air from the outlet, such as but not limited to an adjustable diffuser actuated under the control of the local flow controller. As described herein, an adjustable diffuser can include any suitable outlet structure for directing the local air flow 231 that can also adjustably constrict the local air flow. For example, the controller 216 can control a set of adjustable dampers 246 by a mechanical actuator 248, or any other comparable means. Each cold air outlet 236 can also include a local airflow sensor 218, which can include a pressure sensor and/or a flow rate sensor, and can be used to determine the local flow rate of air through the outlet. In some embodiments, the system 200 can monitor the actual flow rates or pressures achieved at the cold air outlets 236, and adjust the local flow rates of air through the outlets based on those measurements. In some other embodiments, the system 400 can select a local air flow set point based on known cooling requirements of each subset of datacenter electronic components 410, and cause the local flow controller 416 to set the local flow rate based on the set point.

Figure 4:
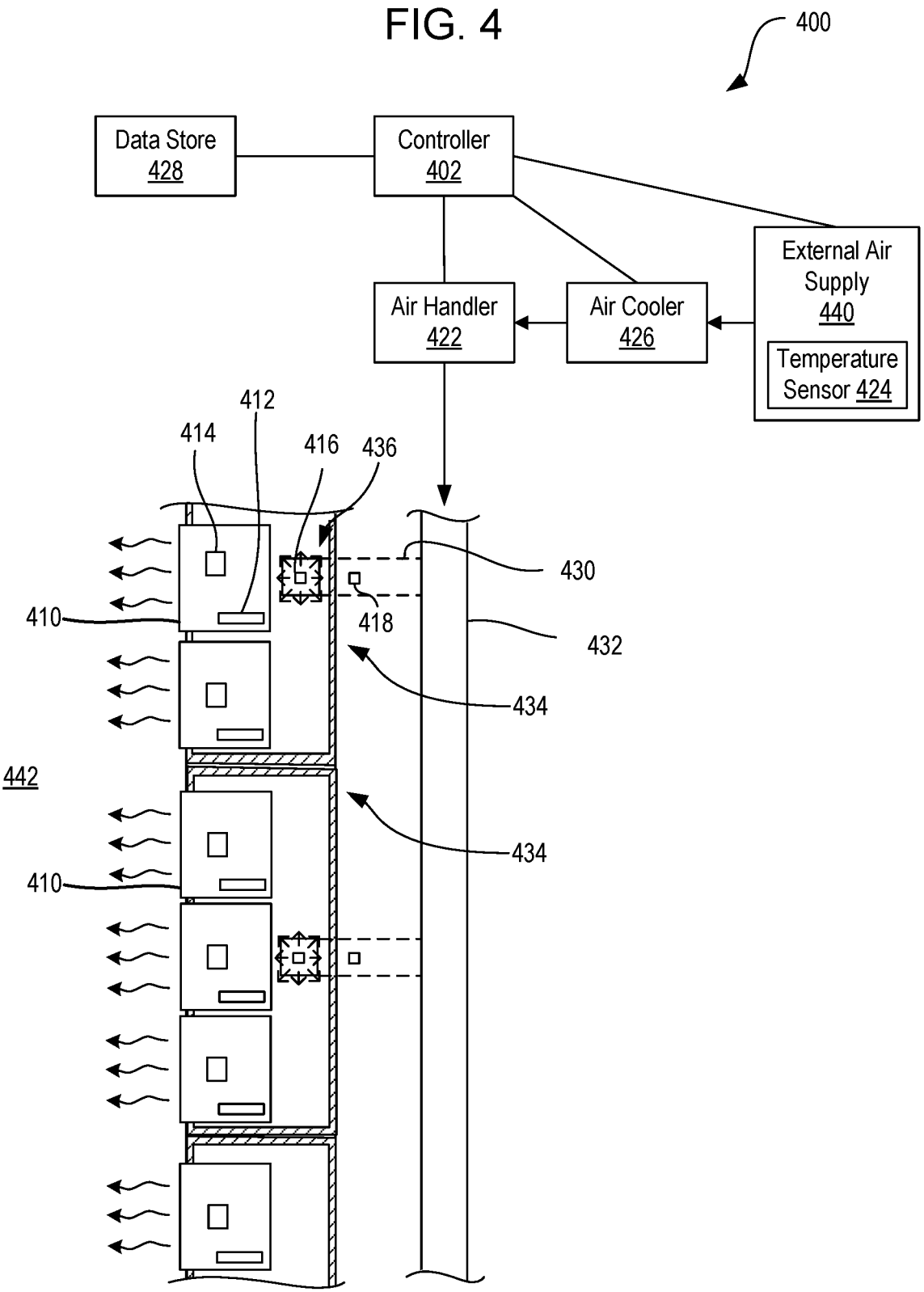
FIG. 4 is a top view diagrammatic illustration of a second example of a discrete datacenter component cooling system, in accordance with various embodiments.

As described above, subsets of electronic devices can include individual server or device racks. However, subsets of components can also be defined according to groups of adjacent server or device racks. For example, FIG. 4 is a top view diagrammatic illustration of a second example of a discrete datacenter component cooling system 400, in accordance with various embodiments in which multiple adjacent sets of devices racks are grouped as subsets of electronic devices 410.

In the cooling system 400, controller 402 (similar to controller 202, FIG. 2) can communicate with the various components of the system 400, including accessing a data store 428, and controlling the operation of external air supply 440 and temperature sensors 424, air cooler 426, and air handler 422, which are similar to the respective components described with reference to FIG. 2. In operation, an external air supply is captured and passed through the air handler 422 and distributed, by way of one or more conduits 432 to multiple local conduits 430, from which the air supply is emitted to cool the subsets of datacenter electronic components 410. After passing through the components 410, the air flows into an exhaust environment 442, such as a hot aisle or the like.

Each subset of datacenter electronic components 410 is arranged to receive a local flow of air from a respective cold air outlet 436 positioned adjacent or near the subset of components. For systems where subsets of datacenter electronic components 410 include multiple component racks, as shown, the local cold air outlets 436 may be centrally located with respect to the components. In some other embodiments, the cold air outlets 436 can be positioned to direct cooling air into group enclosures 434 that form boundaries around each subset of datacenter electronic components. In various other embodiments, the cold air outlets 436 are positioned in an open aisle proximate to their respective subsets of datacenter electronic components 410 without group enclosures, as shown in FIG. 5 below.

In operation, the local air flow 431 emitted from each cold air outlet 436 can be adjusted by the local flow controller 416, which can include any suitable mechanism for adjusting the flow of air from the outlet. Each cold air outlet 436 can also include a local airflow sensor 418, which can include a pressure sensor and/or a flow rate sensor, and can be used to determine the local flow rate of air through the outlet. In some embodiments, the system 400 can monitor the actual flow rates or pressures achieved at the cold air outlets 436, and adjust the local flow rates of air through the outlets based on those measurements. In some other embodiments, the system 400 can select a local air flow set point based on known cumulative cooling requirements of each subset of datacenter electronic components 410, and cause the local flow controller 416 to set the local flow rate based on the selected set point.

Figure 5:
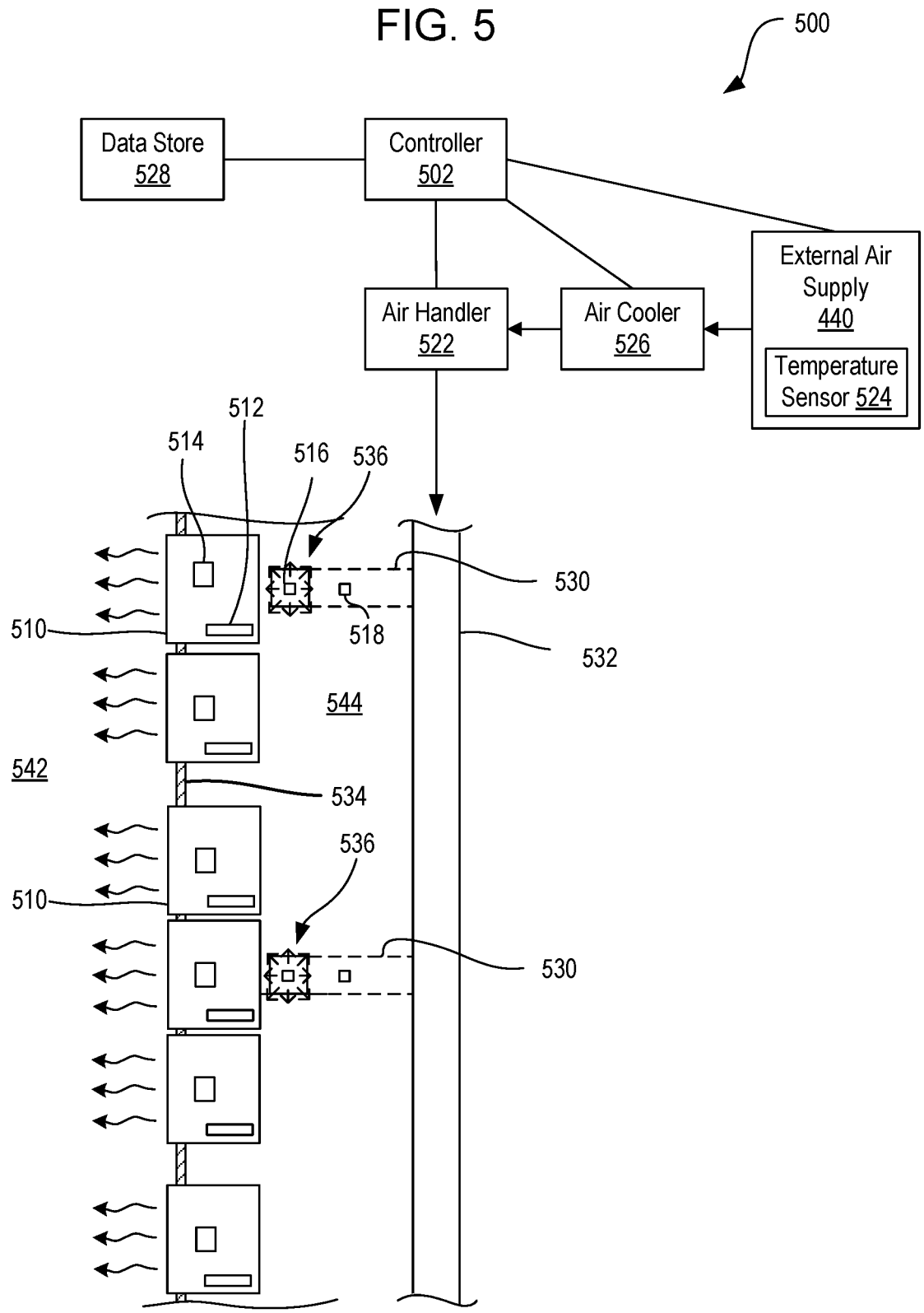
FIG. 5 is a top view diagrammatic illustration of a third example of a discrete datacenter component cooling system, in accordance with various embodiments.

FIG. 5 is a top view diagrammatic illustration of a third example of a discrete datacenter component cooling system 500, in accordance with various embodiments, in which cold air outlets 536 are located adjacent the subsets of electronic devices 510 without individual or group enclosures, in a cold aisle/hot aisle arrangement.

In the cooling system 500, controller 502 (similar to controllers 202, FIGS. 2 and 402, FIG. 4) can communicate with the various components of the system 500, including accessing a data store 528, and controlling the operation of external air supply 540 and temperature sensors 524, air cooler 526, and air handler 522, which are similar to the respective components described with reference to FIGS. 2 and 4.

In operation, an external air supply is captured and passed through the air handler 522 and distributed, by way of one or more conduits 532 to multiple local conduits 530. From each local conduit 530 the air supply is emitted by a series of local cold air outlets 536 into a cold aisle 544 in the vicinity of the subsets of datacenter electronic components 510. After passing through the components 510, the air flows into an exhaust environment 542, such as a hot aisle or the like. The cold aisle 544 and hot aisle 542 can be separated by a divider 534 that prevents or mitigates recirculation of hot air back into the cold aisle.

Each cold air outlet 536 provides a local flow of cold air optimized for the cooling requirements of the adjacent subset of electronic devices 510 located nearest the outlet. In some embodiments, the system 500 can select a local air flow set point based on known cooling requirements of each subset of datacenter electronic components 510, and cause the local flow controller 516 to set the local flow rate based on the set point.

Figure 6:
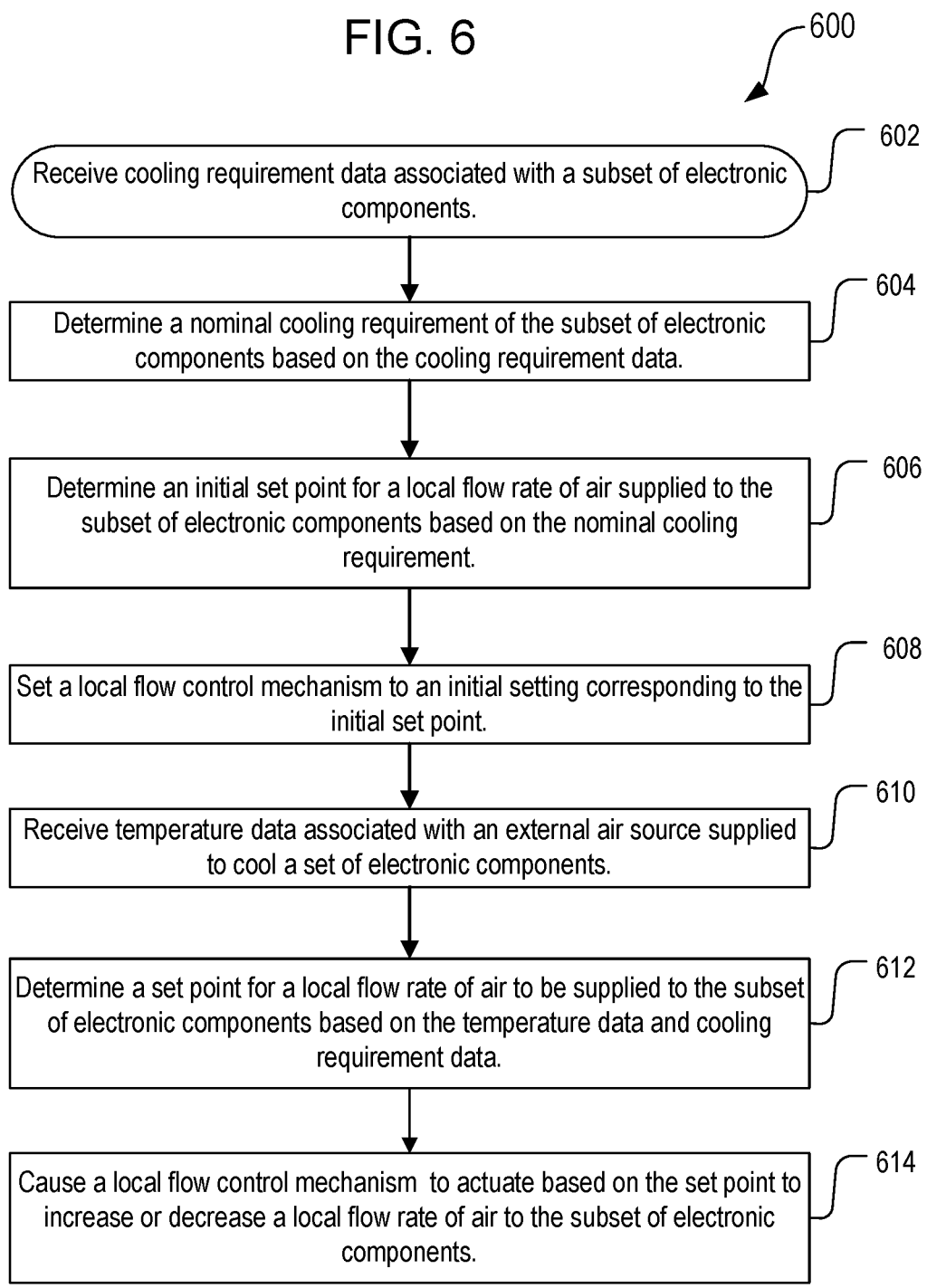
FIG. 6 illustrates a first example process for managing set point-based discrete datacenter component cooling, in accordance with various embodiments.

FIG. 6 illustrates a first example process 600 for managing set point-based discrete datacenter component cooling, in accordance with various embodiments. Steps shown in the example process 600 can be implemented in accordance with systems for cooling one or more datacenter electronic components, for example as shown in systems 100, 200, 400, or 500 of FIG. 1, 2, 4 or 5 and in conjunction with a system having local airflow controllers as described with reference to any of FIGS. 1-5. In particular, the process 600 relates to determining a set point for a subset of datacenter electronic components and adjusting a local flow rate based on the set point.

In various embodiments, the system can receive or access cooling requirement data, e.g., from a data store, associated with a subset of the datacenter electronic components to be cooled (act 602). The system can then determine nominal cooling requirements (e.g., cooling requirements under a particular set of conditions, such as a maximum cooling requirement) for the subset of components based on the cooling requirement data (act 604). In one example, the nominal requirements for a subset of datacenter electronic components correspond to the airflow requirements (e.g., airflow rate, pressure, or a specific outlet setting, etc.) for cooling the components under maximum load at the system's maximum supported temperature. The nominal cooling requirements may be determined based on a known or published manufacturer's requirements for a given set of electronic components, such as a preassembled server rack or an assembly of servers in a rack; may be determined by comparing an assembled subset of electronic components with comparable assemblies in other installations; or may be determined empirically by operating the subset of electronic components, and measuring an airflow rate and associated supply air temperature at which onboard temperatures of the electronic components reach an operational threshold (act 606). When the nominal cooling requirements for a subset of datacenter electronic components have been determined, the local airflow outlet or the local flow control mechanism can be adjusted based on the nominal cooling requirements, e.g., preset to deliver the appropriate flow rate at the maximum load, or preset to deliver the appropriate flow rate at another predefined condition, such as a standard temperature (act 608).

In some cases, the cooling requirement data includes a matrix for each subset of datacenter electronic components that correlates each possible air source temperature with a corresponding airflow requirement for the subset of components at that temperature, or with a corresponding set point corresponding to the local air flow controller setting that will result in the delivery of that airflow requirement. In some embodiments, the cooling requirement data can be more complex, accounting for the different airflow requirements when the system is evaporatively cooled vs. when the system is in a dry cooled state. In such embodiments, the cooling requirement data for each subset of components can include additional sets of airflow requirements corresponding to the evaporatively cooled configuration and to the dry cooled configuration. In some other embodiments, the cooling requirement data can be multidimensional and account for both the temperature of the external air source and the humidity according to stored psychrometric data, with set points based on both the temperature and humidity of the external air source.

Cooling requirement data corresponding to an entire operational range of supply air temperatures can be derived from a small number of data points, as the behavior of component temperatures as a result of inlet temperature and airflow rates is well understood. For example, given a nominal cooling requirement, (e.g., a maximum airflow rate, pressure, fan speed, or the like corresponding to a maximum air supply temperature,) estimates of the actual cooling requirement given an air supply at actual air temperatures lower than the nominal air temperature can be determined. Specific methods of estimating airflow requirements for a given supply air temperature are described in, e.g., "Thermal Guidelines for Data Processing Environments" *American Society of Heating, Refrigerating and Air-Conditioning Engineers* (*ASHRAE*), Third Edition, 2012, as well as "Data Center Networking Equipment—Issues and Best Practices" *ASHRAE Technical Committee* (*TC*) 9.9.

An example of nominal cooling requirements for datacenter electronic components is reproduced below in Table 1.

TABLE 1

Nominal set points for supplied air at maximum utilization

| Maximum Rack Power (kW) | Maximum Diffuser Effective Opening (m²) | Max Airflow Required (m³/s) | Velocity at Max (m/s) | Required Pressure (Pa) |
| --- | --- | --- | --- | --- |
| 30 | 0.28 | 1.87 | 6.71 | 26.9 |
| 20 | 0.37 | 1.25 | 3.35 | 6.7 |
| 45 | 0.37 | 2.80 | 7.54 | 34.1 |

An example of cooling requirement data for a subset of datacenter electronic components in matrix form is reproduced below for reference in Table 2, in which the maximum supply air temperature (100%) is the highest temperature in the allowable range in which the datacenter operates, and the minimum temperature (0%) is the minimum temperature of the allowable range, at which the datacenter no longer requires extra air circulation. Note that evaporative cooling conditions can be used at high temperatures, but that the system is unlikely to utilize evaporative cooling at low temperatures, therefore placeholder set points are used for evaporative cooling cases at low temperatures. Set points are shown in Table 1 with reference to a temperature set point and a pressure set point, but it will be understood that other forms of set points (e.g., flow rate, or the physical setting of a local outlet flow control device), can be used instead in a similar manner.

TABLE 2

Pressure-based local outlet set points

| Supply Air T as % of Allowable Range | Temperature Set Point as % of Range (Evaporative Cooling) | Temperature Set Point as % of Range (Dry Cooling) | Pressure Set Point as % of Range (Evaporative Cooling) | Pressure Set Point as % of Range (Dry Cooling) |
| --- | --- | --- | --- | --- |
| 100% | 100% | 100% | 100% | 100% |
| 87% | 80% | 100% | 85% | 85% |
| 82% | 71% | 89% | 85% | 70% |
| 64% | 71% | 71% | 85% | 48% |
| 55% | 71% | 54% | 85% | 30% |
| 36% | 71% | 36% | 85% | 12% |
| 18% | 71% | 18% | 85% | 9% |
| 0% | 71% | 0% | 85% | 0% |

The system can receive temperature data associated with an external air source supplied to cool a set of datacenter electronic components (act 610). This temperature data can include a dry bulb temperature reading of the outside air, a wet bulb temperature reading of the outside air, a humidity reading of the outside air, or a combination of the above. The temperature data can be used to determine a cooling capacity of the external air source, e.g., the amount of airflow needed at a given temperature and humidity for cooling any given subset of datacenter electronic components. In some cases, the system can also use the temperature data to determine whether air channeled from the external air source requires evaporative cooling, before use in the cooling system. If the air source is evaporatively cooled, the system can maintain evaporative cooling data indicative of whether the air source is evaporatively cooled.

The system can then determine an optimal set point for supplying a local flow of air to the subset of datacenter electronic components based on the received temperature data and cooling requirement data (act 612). As discussed above, set points can include suitable settings for direct or indirect control of the local flow rate of air, such as the volumetric flow rate, a pressure at the local cold air outlet, or a physical parameter such as a flow control setting at a flow control mechanism associated with the cold air outlet. This set point is typically selected from the cooling requirement data, but may also be determined by interpolating between known set point values based on the cooling requirement data. The system can then cause a local flow control mechanism to adjust a flow rate of the local flow of air to the subset of components based on the set point (act 614). This adjustment can include increasing or decreasing the flow rate of the local flow of air to the subset of components in order to match the local flow rate with the required flow rate for cooling the components.

Figure 7:
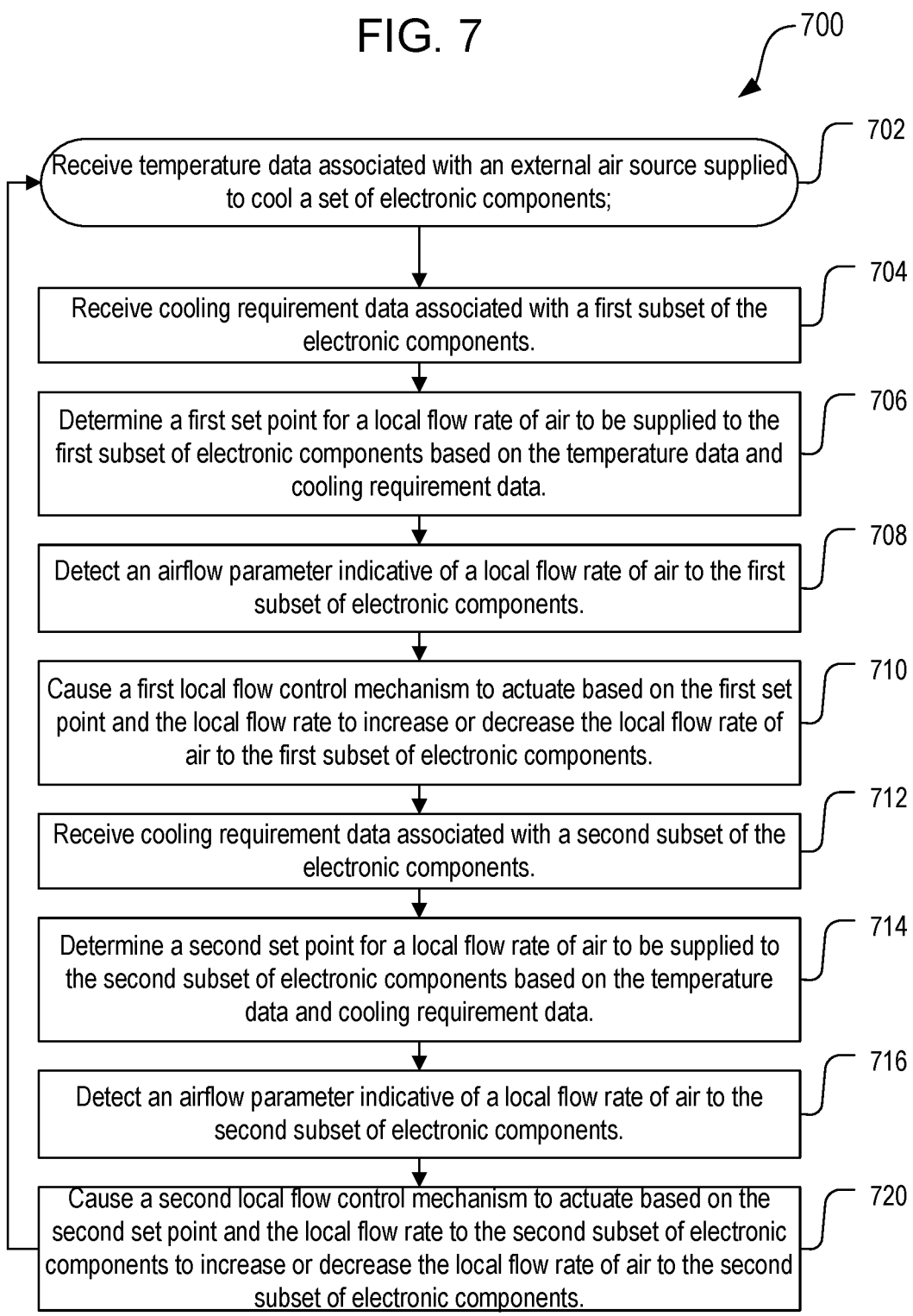
FIG. 7 illustrates a second example process for managing set point-based discrete datacenter component cooling, in accordance with various embodiments.

The process described above may be applied to an arbitrary number of discrete subsets of datacenter electronic components or servers in a datacenter, as described below with reference to FIG. 7. FIG. 7 illustrates a second example process 700 for managing set point-based discrete datacenter component cooling, in accordance with various embodiments. Steps shown in the example process 700 can be implemented in accordance with systems for cooling one or more datacenter electronic components, for example as shown in systems 100, 200, 400, or 500 of FIG. 1, 2, 4 or 5 and in conjunction with a system having local airflow controllers as described with reference to any of FIGS. 1-5. In particular, the process 700 relates to iteratively determining set points for the provision of cooling air locally at multiple subsets of datacenter electronic components.

The system can receive temperature data associated with an external air source supplied to cool a set of datacenter electronic components (act 702), as well as cooling requirement data associated with a first subset of datacenter electronic components (act 704). Similar to process 600 described above, the system can then determine a first set point for a local flow rate of air to be supplied to the first subset of datacenter electronic components based on the temperature data and cooling requirement data (act 706). In some embodiments, the system can also detect an airflow parameter indicative of the actual local flow rate of air to the first subset of datacenter electronic components, e.g., by way of a pressure sensor, flow rate sensor, or other suitable sensor positioned adjacent to or upstream of the local cold air outlet (act 708). The system can then cause a first local flow control mechanism to actuate based on the first set point to increase or decrease the local flow rate of air to the first subset of datacenter electronic components (act 710). In embodiments where the set point directly indicates a setting for the local flow control mechanism, the system can simply instruct the local flow control mechanism to adopt the indicated setting (e.g., setting an adjustable damper to a preset open condition, e.g., 50% open, 70% open, etc.). In various other embodiments where the set point indicates a flow rate or a pressure, the system can instruct the local flow control mechanism to adjust the flow rate until the measured local flow rate matches the set point.

Subsequently, or in parallel with the above, the system can receive cooling requirement data associated with a second subset of the datacenter electronic components (act 712), and determine a second set point for a local flow rate of air to be supplied to the second subset of datacenter electronic components based on the temperature data and cooling requirement data (act 714). The system can then detect an airflow parameter indicative of a local flow rate of air to the second subset of datacenter electronic components (act 716). The system can then cause a second local flow control mechanism to actuate based on the second set point and the local flow rate to the second subset of datacenter electronic components to increase or decrease the local flow rate of air to the second subset of datacenter electronic components (act 720). In some cases, the management of cooling across multiple discrete cold air outlets can cause variations in system pressure. Such variation can be managed by iteratively receiving external air source temperature data and adjusting the local flow rates to each subset of datacenter electronic components. Alternatively, the system can adjust the amount of external air supplied to the system as a whole based on the cumulative cooling requirements across all of the subsets of datacenter electronic components.

In the embodiments described above, a set point can be determined based on stored cooling requirement information for each subset of datacenter electronic components. According to various embodiments, cooling requirements for a subset of datacenter electronic components can be estimated based on parameters of the components including the power requirements or load on the components, and then used to determine a set point, as described with reference to FIG. 8.

Figure 8:
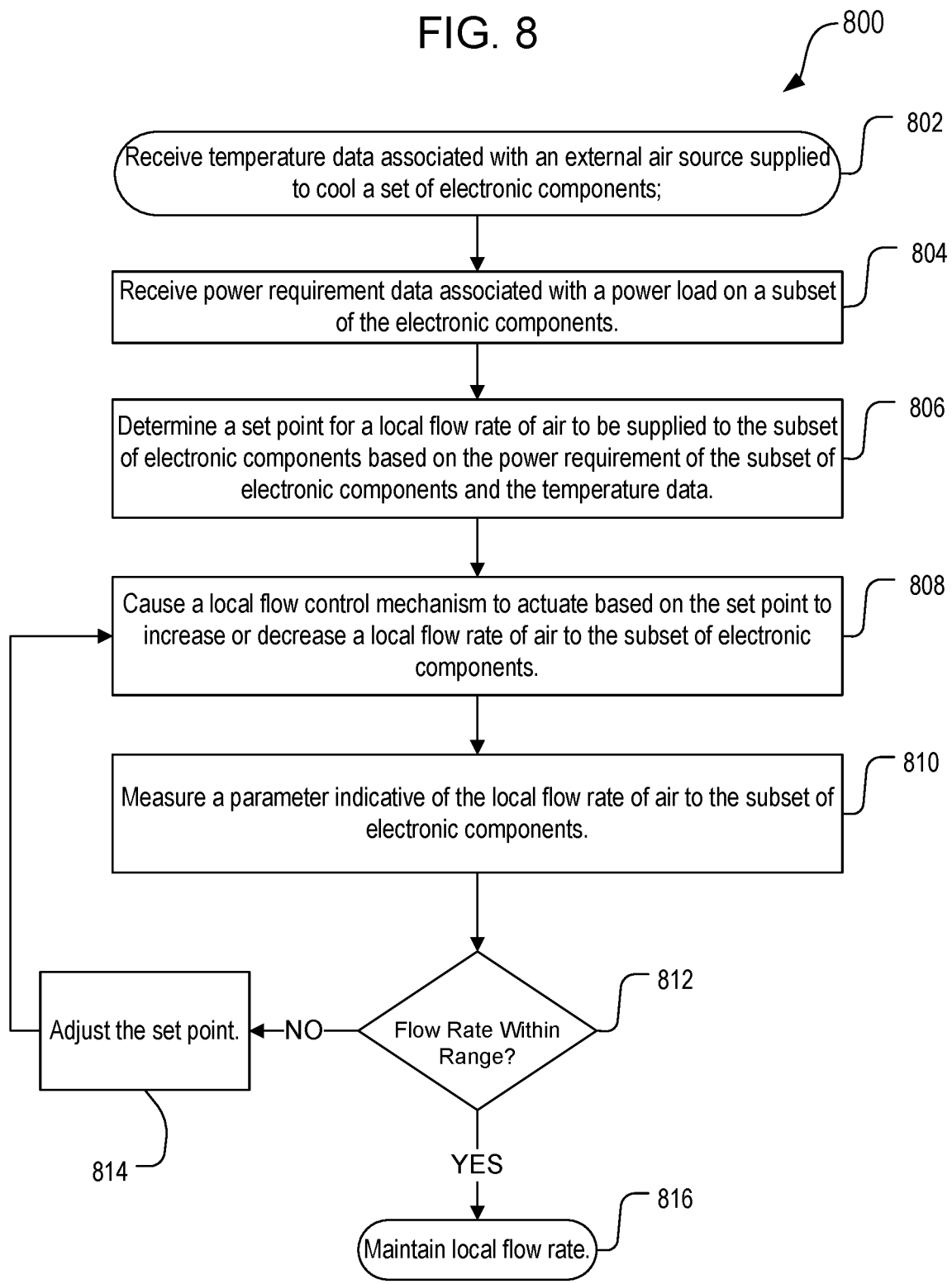
FIG. 8 illustrates a third example process for managing set point-based discrete datacenter component cooling, in accordance with various embodiments.

FIG. 8 illustrates a third example process 800 for managing set point-based discrete datacenter component cooling, in accordance with various embodiments. Steps shown in the example process 800 can be implemented in accordance with systems for cooling one or more datacenter electronic components, for example as shown in systems 100, 200, 400, or 500 of FIG. 1, 2, 4 or 5 and in conjunction with a system having local airflow controllers as described with reference to any of FIGS. 1-5. In particular, the process 800 relates to determining a set point for a subset of datacenter electronic components based on a power requirement of the subset of components, adjusting a local flow rate based on the set point, and monitoring the local flow rate for deviation from an expected flow rate corresponding to the set point.

The system can receive temperature data associated with an external air source supplied to cool a set of datacenter electronic components (act 802), as well as power requirement data associated with a power load on a subset of the datacenter electronic components (act 804). The system can then determine a set point for a local flow rate of air to be supplied to the subset of datacenter electronic components based on the power requirement of the subset of datacenter electronic components and the temperature data (act 806). In some embodiments, determining the set point can include retrieving cooling requirement data corresponding to the cumulative power requirement or load on the subset of datacenter electronic components. For example, the cooling requirement data can include a plurality of cooling requirement data sets, each corresponding to a specific power requirement or range of power requirements; and the system can first select the appropriate cooling requirement data set based on the power requirement, and then select the appropriate set point from that data set based on the temperature data. In another embodiment, the system can maintain an array of correlated power requirement, external air source temperatures, and set point values, and determine the set point directly from the array based on the received power requirement and temperature data. In some embodiments, the system can iteratively receive power requirement data as electronic component loads cycle up or down, and the system can propagate appropriate changes in the cooling set point based on changes in load.

When the set point is determined, the system can cause a local flow control mechanism to actuate based on the set point to increase or decrease a local flow rate of air to the subset of datacenter electronic components (act 808). In some embodiments, the system can also measure a parameter indicative of the local flow rate of air to the subset of datacenter electronic components to determine whether the actual flow rate meets the cooling requirements (act 810), and if the flow rate falls outside a range associated with the cooling requirement (act 812), the system can adjust the set point (act 814). In some embodiments, the system can detect whether the flow rate is sufficient by based on temperature information at the subset of datacenter electronic components. If the actual flow rate is within a range corresponding to the cooling requirement, the system can maintain the local flow rate according to the determined set point (act 816). In some embodiments, the system may periodically update the cooling requirement data set based on changes to set points as described above, and subsequently propagate information about successful set point changes to peer networks or other controllers (e.g., peer network/controller 130, FIG. 1).

FIG. 9 illustrates a fourth example process 900 for managing set point-based discrete datacenter component cooling, in accordance with various embodiments. Steps shown in the example process 900 can be implemented in accordance with systems for cooling one or more datacenter electronic components, for example as shown in systems 100, 200, 400, or 500 of FIG. 1, 2, 4 or 5 and in conjunction with a system having local airflow controllers as described with reference to any of FIGS. 1-5. In particular, the process 900 relates to an additional step of determining or selecting a set point based in part on whether the cooling system is engaged in evaporative cooling of the external air source.

The system can receive temperature data associated with an external air source supplied to cool a set of datacenter electronic components (act 902), and detect whether the external air source is being supplied in an evaporatively cooled configuration or in a dry cooled configuration (act 904). The evaporatively cooled configuration can be selected by the system in response to detecting that the external air source is above a threshold temperature, e.g., about 27° C., although any suitable temperature may be used as the threshold. In some embodiments, the system can maintain the supply air temperature at or below a specific temperature when the system is employing evaporative cooling. If the system is in the evaporatively cooled configuration (act 906), the system can access cooling requirement data for the subset of datacenter electronic components corresponding to the received temperature data for the evaporatively cooled configuration (act 908). The cooling requirements using evaporatively cooled air can differ from those using relatively dry air due to the change in humidity and concomitant change in thermodynamic properties of the air. Conversely, if the system is in the dry cooled configuration, the system can access cooling requirement data for the subset of datacenter electronic components corresponding to the dry cooled configuration (act 910).

For both the evaporatively cooled and dry cooled configurations, the system can determine a set point from the received cooling requirement data for supplying a local flow of air to the subset of datacenter electronic components based on the received temperature data (act 912), according to any of the methods described above. The system can then cause a local flow control mechanism to actuate based on the set point to increase or decrease a local flow rate of air to the subset of datacenter electronic components (act 914).

Some or all of the processes 600, 700, 800, and 900 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as interface 148, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. The server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for controlling airflow in a datacenter, the system comprising:
    a conduit arranged along a length of a cold aisle for transporting a flow of cold air from an air source to the cold aisle for cooling of electronic components;
    a temperature sensor configured to detect a temperature of the flow of cold air;
    a first cold air outlet configured to outlet a first portion of the flow of cold air into a first location of the cold aisle to cool a first subset of the electronic components, wherein the first subset of the electronic components is positioned proximate to the first location of the cold aisle;
    a first flow control mechanism operable to control a rate of flow of the first portion of the flow of cold air;
    a second cold air outlet configured to outlet a second portion of the flow of cold air into a second location of the cold aisle to cool a second subset of the electronic components, wherein the second subset of the electronic components is positioned proximate to the second location of the cold aisle, wherein the second location is offset from the first location;
    a second flow control mechanism operable to control a rate of flow of the second portion of the flow of cold air; and
    a controller comprising at least one processor and tangible non-transitory memory containing instructions that, when executed by the at least one processor, cause the controller to:
        determine an evaporative cooling status of the flow of cold air;
        determine a first cooling requirement for the first subset of the electronic components based on cumulative cooling requirement data of multiple electronic components within the first subset of the electronic components;
        select a first set point for cooling the first subset of the electronic components based on the first cooling requirement, the temperature of the flow of cold air, and the evaporative cooling status of the flow of cold air, the first set point selected from one of a first group of set points corresponding to an evaporatively cooled condition or a second group of set points corresponding to an uncooled cooled condition based on whether the air source is being evaporatively cooled;
        selectively adjust the rate of flow of the first portion of the flow of cold air to meet the first cooling requirement based on the first set point;
        determine a second cooling requirement for the second subset of the electronic components based on the temperature of the flow of cold air and cumulative cooling requirement data of multiple electronic components within the second subset of the electronic components;

select a second set point for cooling the second subset of the electronic components based on the second cooling requirement, the temperature of the flow of cold air, and the evaporative cooling status of the flow of cold air; and selectively adjust the rate of flow of the second portion of the flow of cold air to meet the second cooling requirement based on the second set point.

2. The system of claim 1, wherein each of the first flow control mechanism and the second flow control mechanism comprise a respective adjustable diffuser and an actuator connected with the respective adjustable diffuser, the actuator operable to, under control of the controller, increase or decrease the rate of flow of a respective local flow of cold air through the respective adjustable diffuser.

3. The system of claim 1, further comprising a first enclosure that at least partly surrounds the first subset of the electronic components within the cold aisle and a second enclosure that at least partly surrounds the second subset of the electronic components within the cold aisle, the first enclosure and the second enclosure arranged to prevent intermixing of respective first and second local flows of cold air from the first cold air outlet and from the second cold air outlet.

4. The system of claim 1, further comprising:

an evaporative cooling module arranged upstream of the conduit and operable to cool the flow of cold air prior to the flow of cold air entering the conduit, wherein the instructions comprise further instructions that, when executed by the at least one processor, cause the controller to additionally:

determine, based on the temperature of the flow of cold air, whether the air source is above a threshold temperature; and in response to determining that the air source is above the threshold temperature, cause the evaporative cooling module to cool the flow of air.

5. The system of claim 4, wherein the controller is further configured to:

receive evaporative cooling information from the evaporative cooling module indicative of whether the air source is being evaporatively cooled, and wherein the instructions to select the first set point and the second set point comprise further instructions that, when executed by the at least one processor, cause the controller to select the first set point and the second set point further based on the evaporative cooling information.

6. The system of claim 5, further comprising a data store storing the cumulative cooling requirement data, wherein the cumulative cooling requirement data comprises a matrix associating a plurality of air supply temperatures with a first plurality of set points corresponding to an evaporatively cooled state and a second plurality of set points corresponding to an uncooled state, wherein the controller is further configured to:

access the matrix from the data store; and receive evaporative cooling information from the evaporative cooling module to determine whether the air supply is in the evaporatively cooled state or the uncooled state, and wherein the instructions to select the first set point and the second set point comprise further instructions that, when executed by the at least one processor, cause the controller to:

if the air supply is in the evaporatively cooled state, select the first set point and the second set point from the first plurality of set points; and if the air supply is in the uncooled state, select the first set point and the second set point from the second plurality of set points.

7. The system of claim 1, further comprising a data store storing the cumulative cooling requirement data, wherein the cumulative cooling requirement data comprises a matrix associating a plurality of air supply temperatures with a plurality of set points, wherein the controller is further configured to:

access the matrix from the data store; and select the first set point from the plurality of set points by comparing the temperature of the flow of cold air with the plurality of air supply temperatures.

8. A computer-implemented method, comprising:

receiving temperature data associated with an air source supplied to cool a plurality of electronic components of a datacenter, wherein the electronic components are arranged along a cold aisle that receives a flow of cooling air from the air source via a conduit positioned along a length of the cold aisle;

determining a first cooling requirement of a first subset of the electronic components within a distance from a first outlet of the conduit based on cumulative cooling requirement data of multiple electronic components in the first subset of the electronic components;

determining an evaporative cooling status of the flow of cooling air indicative of whether the flow of cooling air is evaporatively cooled;

determining, based on the temperature data, the evaporative cooling status, and the first cooling requirement, a set point corresponding to a first local flow rate of air to be supplied from a first outlet of the conduit at a first location along the cold aisle proximate to the first subset of electronic components, wherein the set point is selected from one of a first group of set points corresponding to an evaporatively cooled condition or a second group of set points corresponding to an uncooled cooled condition based on whether the air source is being evaporatively cooled; and selectively adjusting the first local flow rate of air to the first subset of the electronic components based on the set point in order to cause the first subset of the electronic components to meet the first cooling requirement.

9. The computer-implemented method of claim 8, further comprising:

determining a second cooling requirement of a second subset of the electronic components of the datacenter, the first and second subsets of electronic components of the datacenter each comprising multiple electronic components that are physically separate from each other;

determining, based on the temperature data and the second cooling requirement, a second set point corresponding to the second subset of electronic components of the datacenter; and selectively adjusting a second local flow rate of air to the second subset of the electronic components based on the second set point.

10. The computer-implemented method of claim 8, wherein adjusting the first local flow rate comprises causing an adjustable diffuser associated with the first subset of the electronic components to open or close.

11. The computer-implemented method of claim 8, further comprising:
receiving nominal cooling requirement data associated with the first subset of the electronic components, the nominal cooling requirement data comprising a flow rate for cooling the first subset of the electronic components under maximum load at a maximum supported supply air temperature; and
adjusting the first local flow rate of air at the first subset of the electronic components of the datacenter to an initial setting based on the nominal cooling requirement data.

12. The computer-implemented method of claim 8, wherein the cumulative cooling requirement data comprises a matrix associating each value of a plurality of power requirement values with a respective set of associated air supply temperature values and corresponding set point values, the method further comprising:
receiving power requirement data associated with a power load on the electronic components; and
determining the set point for the first subset of electronic components based in part on the cumulative cooling requirement data and the power requirement data associated with the first subset of electronic components.

13. The computer-implemented method of claim 8, wherein the cumulative cooling requirement data comprises a matrix associating a plurality of air supply temperatures with a plurality of set points, and wherein determining the set point comprises selecting the set point from the plurality of set points by comparing the temperature data with the plurality of air supply temperatures.

14. The computer-implemented method of claim 8, wherein the set point is one of a set point corresponding to an air pressure upstream of the first subset of electronic components or a diffuser aperture set point corresponding to an extent to which a diffuser is opened upstream of the first subset of electronic components.

15. The computer-implemented method of claim 8, wherein the set point is a pressure set point, the method further comprising:
detecting a measured pressure at a diffuser upstream of the first outlet;
comparing the measured pressure with the set point; and
adjusting the first local flow rate based on the comparing to align the measured pressure with the pressure set point.

16. A non-transitory computer-readable storage medium storing computer-executable instructions that, when executed by a processor, cause the processor to perform operations, comprising:
receiving temperature data associated with an air source supplied to cool electronic components of a datacenter, wherein the electronic components are arranged along a cold aisle of the datacenter and supplied with local flows of cooling air from a conduit in fluid communication with the air source at discrete locations along a length of the cold aisle;
determining a first cooling requirement of a first subset of the electronic components within a distance from a first outlet of the conduit based on cumulative cooling requirement data of multiple electronic components in the first subset;
determining an evaporative cooling status of the flow of cooling air indicative of whether the flow of cooling air is evaporatively cooled;
determining, based on the temperature data, the evaporative cooling status, and the first cooling requirement, a set point corresponding to a first local flow rate of air to be supplied from the first outlet to the first subset of electronic components, wherein the set point is selected from one of a first group of set points corresponding to an evaporatively cooled condition or a second group of set points corresponding to an uncooled cooled condition based on whether the air source is being evaporatively cooled; and
causing a local airflow adjustment mechanism associated with the first outlet to adjust the first local flow rate of air based on the set point.

17. The non-transitory computer-readable storage medium of claim 16, wherein:
the cumulative cooling requirement data comprises a matrix associating a plurality of air supply temperatures with a plurality of set points; and
determining the set point comprises selecting the set point from the plurality of set points based on the first cooling requirement and the received temperature data.

18. The non-transitory computer-readable storage medium of claim 16, wherein the operations further comprise:
determining an optimal setting of the local airflow adjustment mechanism configured to deliver an optimal local air flow to each one of the first subset of electronic components and to a second subset of electronic components based on a matrix associating a plurality of configurations with a plurality of set points;
detecting a physical setting of the local airflow adjustment mechanism; and
causing the local airflow adjustment mechanism to open or close to adopt the optimal setting based on a comparison of the physical setting and optimal setting.

19. The non-transitory computer-readable storage medium of claim 16, wherein:
the cumulative cooling requirement data comprises a matrix associating a plurality of air supply temperatures with a first plurality of set points corresponding to an evaporatively cooled state and a second plurality of set points corresponding to an uncooled state;
determining the set point comprises selecting the set point from one of the first or second pluralities of set points; and
the operations further comprise:
detecting whether the air source is in the evaporatively cooled state or in the uncooled state;
in response to detecting that the air supply is in the evaporatively cooled state, selecting the set point from the first plurality of set points; and
in response to detecting that the air supply is in the uncooled state, selecting the set point from the second plurality of set points.

20. The non-transitory computer-readable storage medium of claim 16, wherein:
the electronic components comprise a plurality of datacenter electronic components installed in a plurality of component racks; and
the first subset of the electronic components consists of the datacenter electronic components in a particular rack of the plurality of component racks.

* * * * *